(12) United States Patent
Yang et al.

(10) Patent No.: US 11,167,284 B2
(45) Date of Patent: Nov. 9, 2021

(54) SUBSTRATE ASSEMBLY AND METHOD OF BONDING SUBSTRATES

(71) Applicant: TAIWAN GREEN POINT ENTERPRISES CO., LTD., Taichung (TW)

(72) Inventors: Sung-Yi Yang, Taichung (TW); Pao-Chuan Wang, Taichung (TW)

(73) Assignee: Taiwan Green Point Enterprises Co., Ltd., Taichung (TW)

( * ) Notice: Subject to any disclaimer, the term of this patent is extended or adjusted under 35 U.S.C. 154(b) by 230 days.

(21) Appl. No.: 16/172,116

(22) Filed: Oct. 26, 2018

(65) Prior Publication Data

US 2019/0126272 A1 May 2, 2019

(30) Foreign Application Priority Data

Nov. 1, 2017 (TW) .................................. 106137719

(51) Int. Cl.
*B01L 3/00* (2006.01)
*B81B 7/00* (2006.01)
(Continued)

(52) U.S. Cl.
CPC ... *B01L 3/502707* (2013.01); *B01L 3/502715* (2013.01); *B32B 3/266* (2013.01); *B32B 3/30* (2013.01); *B32B 7/12* (2013.01); *B32B 27/08* (2013.01); *B81B 7/0025* (2013.01); *B81C 3/001* (2013.01); *B01L 2200/12* (2013.01); *B01L 2300/0816* (2013.01);
(Continued)

(58) Field of Classification Search
CPC ...................... B01L 3/502707; B01L 3/502715
See application file for complete search history.

(56) References Cited

U.S. PATENT DOCUMENTS

| 8,951,716 B2 | 2/2015 | Liu et al. | |
| 2003/0213551 A1* | 11/2003 | Derand | B01L 3/502707 156/272.2 |
| 2009/0060791 A1* | 3/2009 | Hagiwara | B29C 66/53461 422/68.1 |

FOREIGN PATENT DOCUMENTS

| TW | I263046 B | 10/2006 |
| TW | M538153 U | 3/2017 |

OTHER PUBLICATIONS

Search Report appended to an Office Action issued to Taiwanese counterpart application No. 106137719 by the TIPO dated May 10, 2018 and English translation (2 pages).

(Continued)

*Primary Examiner* — Brian R Gordon
*Assistant Examiner* — Dwan A Gerido
(74) *Attorney, Agent, or Firm* — Young Basile Hanlon & MacFarlane, P.C.

(57) ABSTRACT

A substrate assembly includes a first substrate, a second substrate and a bonding member. The first substrate includes a first surface-modified region having a functionality different from that of a remainder region of the first substrate. The second substrate includes a second surface-modified region connected to the first surface-modified region through a physical interaction and having a functionality different from that of a remainder region of the second substrate. The first and second substrates cooperatively define a space therebetween. The bonding member is disposed within said space to bond said first and second substrates together. A method for bonding substrates is also disclosed.

10 Claims, 15 Drawing Sheets

(51) Int. Cl.
  *B81C 3/00* (2006.01)
  *B32B 3/30* (2006.01)
  *B32B 3/26* (2006.01)
  *B32B 27/08* (2006.01)
  *B32B 7/12* (2006.01)

(52) U.S. Cl.
  CPC ............... *B01L 2300/0883* (2013.01); *B01L 2300/0887* (2013.01); *B32B 2307/73* (2013.01); *B81B 2201/05* (2013.01); *B81B 2203/0338* (2013.01); *B81B 2203/0353* (2013.01); *B81C 2203/032* (2013.01)

(56) References Cited

OTHER PUBLICATIONS

Young-Jon Kim, "Vacuum Ultraviolet Surface Modification of Organic Materials," Doctoral Dissertation, Kyoto University, Sep. 24, 2008.

\* cited by examiner

SUBSTRATE ASSEMBLY AND METHOD OF BONDING SUBSTRATES

CROSS-REFERENCE TO RELATED APPLICATION

This application claims priority of Taiwanese Invention Patent Application No. 106137719, filed on Nov. 1, 2017.

FIELD

The disclosure relates to a substrate assembly and a method of bonding substrates, and more particularly to a substrate assembly and a method of bonding substrates by virtue of an adhesive and physical interaction between surface-modified regions of substrates.

BACKGROUND

Referring to FIGS. 1 and 2, a conventional method of bonding substrates of a biodetective microfluidic device includes steps of: (a) providing two substrates 11 made of cyclo-olefin polymer; (b) applying vacuum ultraviolet (VUV) light to a surface of each of the substrates 11 to form a VUV-modified surface 111 on each of the two substrates 11; and (c) contacting and thereto-compressing the VUV-modified surfaces 111 so that the substrates 11 are connected to each other and are bonded together, thereby obtaining a substrate assembly 1.

In step (b), the hydrophobic surfaces of the substrates 11 are modified using VUV radiation to have hydrophilic functional groups (such as ether group, ketone group, carboxyl group, etc.) thereon. In step (c), the substrates 11 are bonded together through the interaction of the hydrophilic functional groups of the modified surfaces 111. The substrate device 1 thus prepared may be susceptible to bending or deformation by an external force, thereby causing separation of the bonded substrates 11. In addition, moisture may enter the interface between the two substrates 11 and weaken the interaction of the hydrophilic function groups on the modified surfaces 111, causing separation of the bonded substrates 11.

Therefore, the applicant endeavors to develop a method of bonding substrates to prevent separation of the bonded substrates due to external force and to prevent moisture from entering the interface of the bonded substrates.

SUMMARY

Therefore, an object of the disclosure is to provide a substrate assembly that can alleviate at least one of the drawbacks of the prior art.

Another object of the disclosure is to provide a method of bonding substrates that can alleviate the drawback of the prior art.

According to a first aspect of the present disclosure, the substrate assembly includes a first substrate, a second substrate and a bonding member. The first substrate includes a first surface-modified region which has a functionality different from that of a remainder region of the first substrate. The second substrate includes a second surface-modified region that is connected to the first surface-modified region (20) and that has a functionality different from that of a remainder region of the second substrate. The first and second substrates cooperatively define a space therebetween. The bonding member is disposed within the space to bond the first and second substrates together.

According to a second aspect of the present disclosure, the method of bonding substrates includes steps of:
 providing a first substrate and a second substrate;
 subjecting a first connecting surface of the first substrate and a second connecting surface of the second substrate to a surface-modifying treatment, so as to form a first surface-modified region on the first connecting surface and a second surface-modified region on the second connecting surface, the first surface-modified region having a functionality different from that of a remainder region of the first substrate, the second surface-modified region having a functionality different from that of a remainder region of the first substrate;
 contacting the first and second substrates in such a manner that the first and second substrates are connected with each other through a physical interaction between the first and second surface-modified regions, the first and second substrates cooperatively defining a space therebetween; and
 providing a bonding member within the space to bond the first and second substrates together.

According to a third aspect of the present disclosure, the method of bonding substrates includes steps of:
 providing a first substrate and a second substrate;
 subjecting a first connecting surface of the first substrate and a second connecting surface of the second substrate to a surface-modifying treatment using an energy source, so as to form a first surface-modified region on the first connecting surface and a second surface-modified region on the second connecting surface, the energy source being selected from the group consisting of a plasma, a light irradiation and the combination thereof;
 contacting the first and second substrates in such a manner that the first and second substrates are connected with each other through a physical interaction between the first and second surface-modified regions, the first and second substrates cooperatively defining a space therebetween; and
 providing a bonding member within the space to bond the first and second substrates together.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
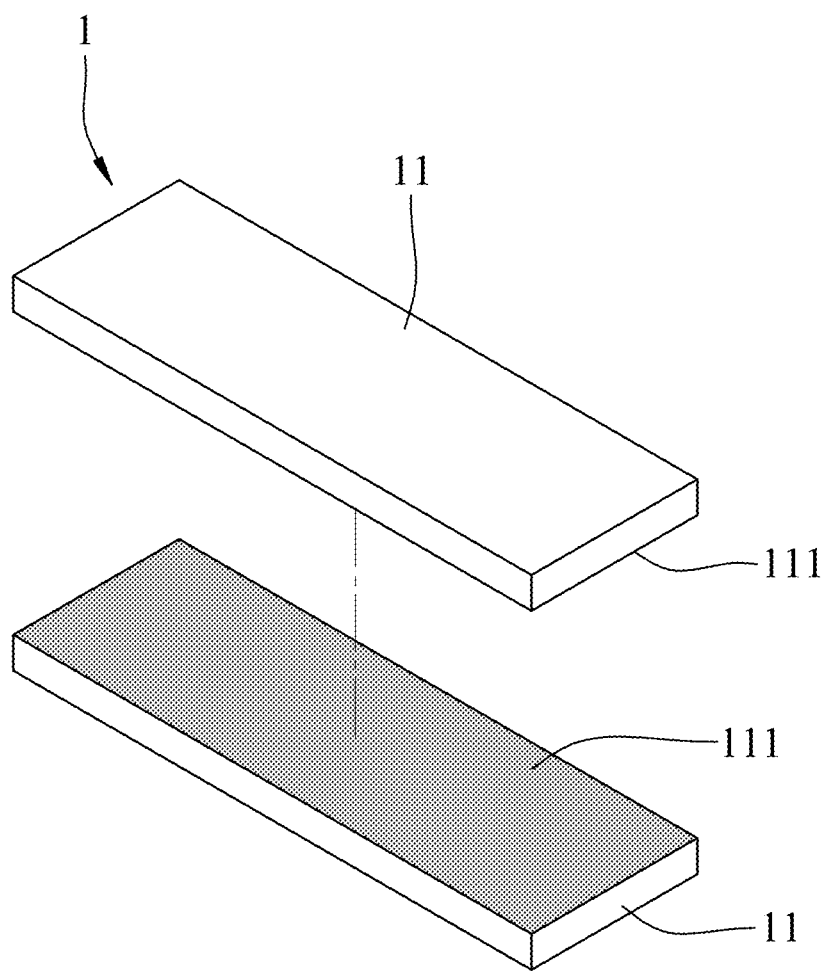
FIG. 1 is an exploded perspective view illustrating a conventional substrate assembly obtained by a conventional process of bonding substrates.

Before the disclosure is described in greater detail, it should be noted that where considered appropriate, reference numerals or terminal portions of reference numerals have been repeated among the figures to indicate corresponding or analogous elements, which may optionally have similar characteristics.

Further, in describing representative embodiments of the present disclosure, the method and/or process of the present disclosure may be presented as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

Figure 3:
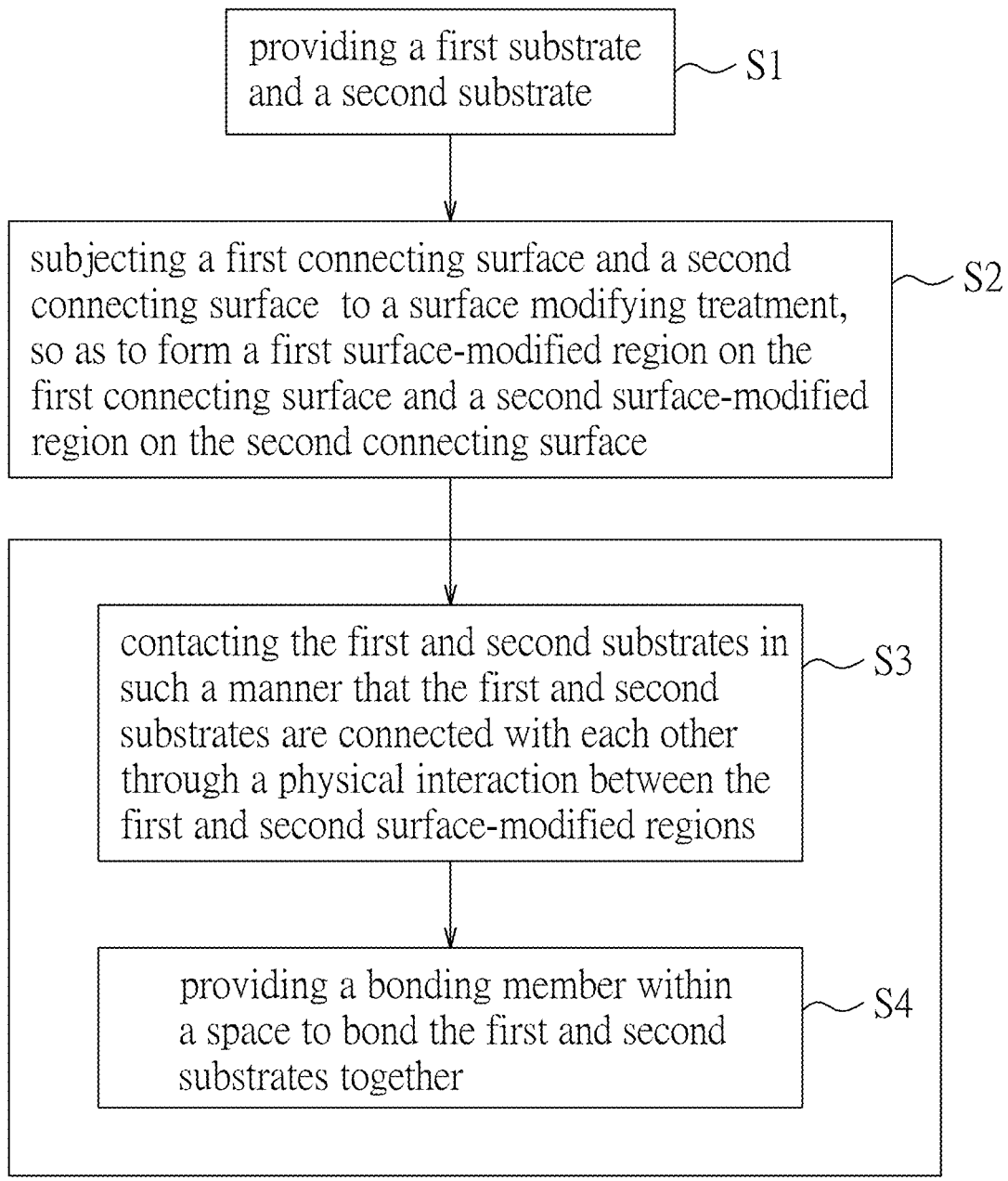
FIG. 3 is a flow chart illustrating steps of a method of bonding substrates according to the disclosure.
Figure 4:
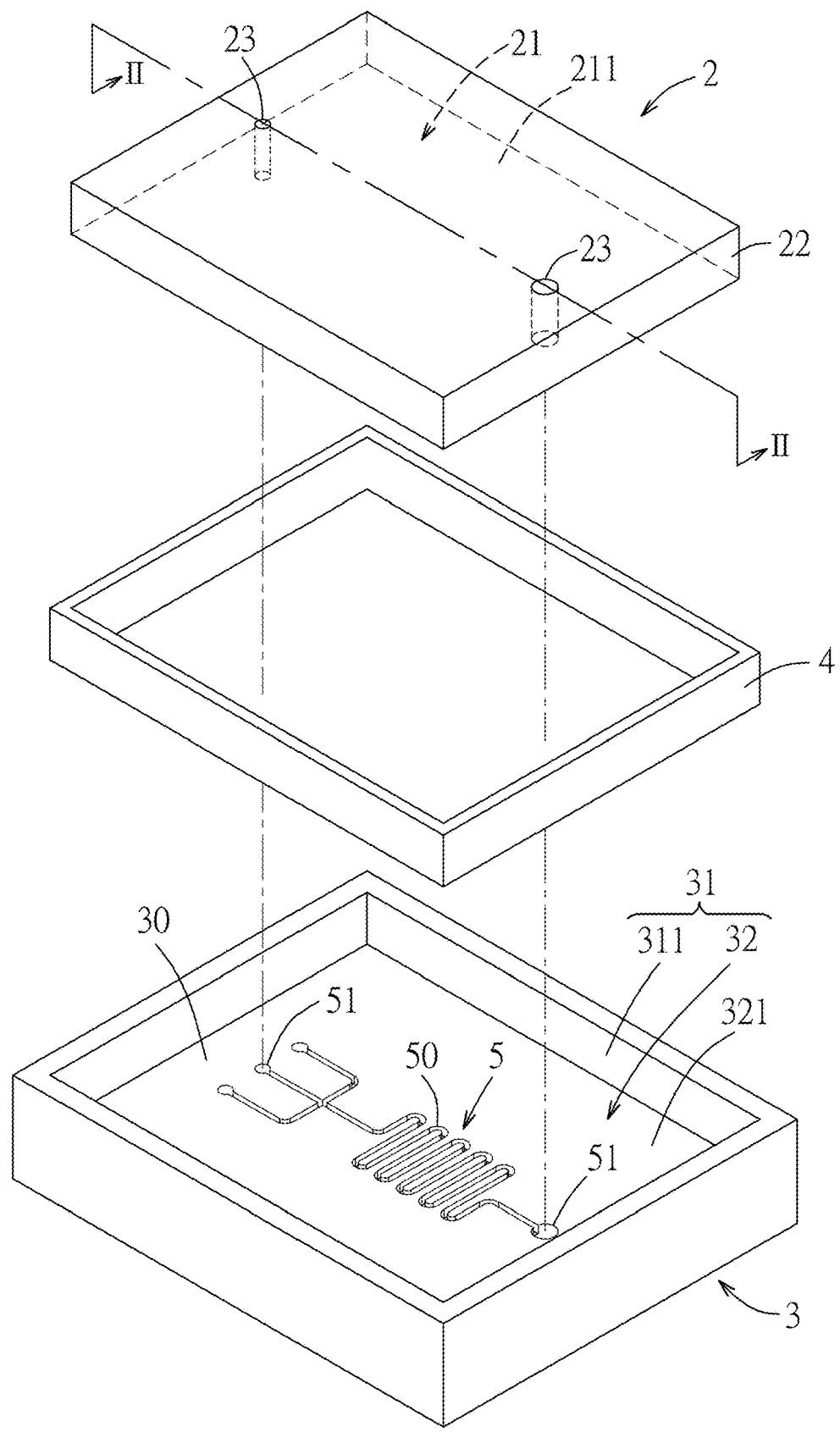
FIG. 4 is a schematic perspective view illustrating a first embodiment of a substrate assembly according to this disclosure.
Figure 5:
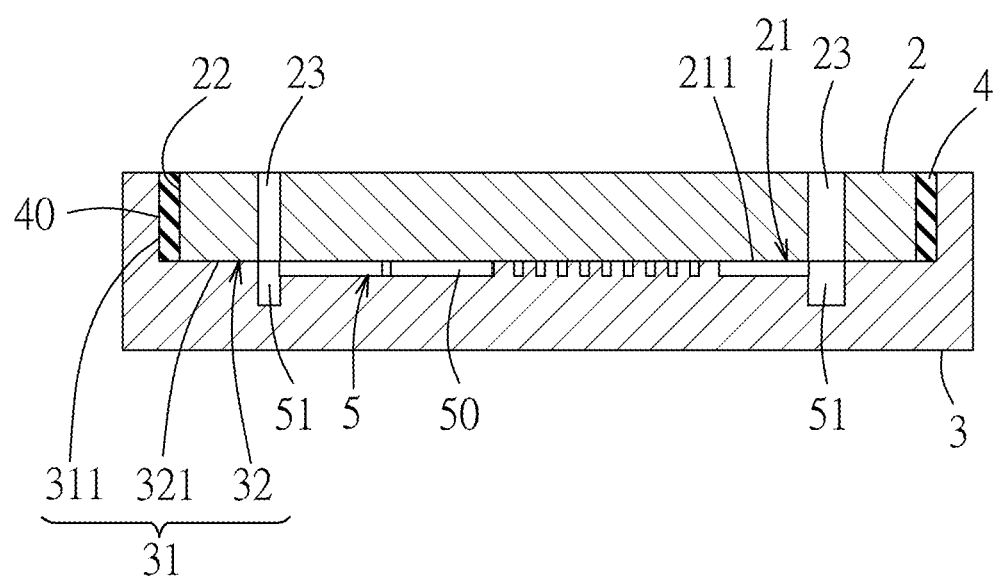
FIG. 5 is a sectional view taken along line II-II in FIG. 4.

Referring to FIG. 3, a method of bonding substrates according to the disclosure is suitable for manufacturing a first embodiment of a substrate assembly (see FIGS. 3 and 4). The method includes the following steps S1 to S4.

Step S1: providing a first substrate 2 and a second substrate 3. In the first embodiment, the first substrate includes a first connecting surface 21, a first peripheral surface 22 connected to and angularly extending from the first connecting surface 21, and two spaced-apart through holes 23. The second substrate 3 is formed with a recess 30, which is defined by a recess-defining surface 31 having a second connecting surface 32 and a surrounding surface 311 extending upwardly from the second connecting surface 32. One of the first and second connecting surfaces 21,32 may be formed with a channel 50. In this embodiment, the channel 50 is formed on the second connecting surface 32.

According to this disclosure, the first and second substrates 2,3 may be made of the same or different materials, such as a hydrophobic polymer material. Examples of the hydrophobic polymer material include, but are not limited to, polymethylmethacrylate (PMMA), polycarbonate (PC), polystyrene (PS), cyclo olefin polymer (COP), polyethylene terephthalate (PET), and combinations thereof. In the first embodiment, each of the first and second substrates 2,3 is made of PMMA.

Step S2: subjecting the first connecting surface 21 and the second connecting surface 32 to a surface modifying treatment, so as to form a first surface-modified region 211 on the first connecting surface 21 and a second surface-modified region 321 on the second connecting surface 32. The first surface-modified region 211 has a functionality different from that of a remainder region of the first substrate 2, and the second surface-modified region 321 has a functionality different from that of a remainder region of the second substrate 3.

According to this disclosure, the surface modifying treatment may be conducted by applying an energy source to the first and second connecting surfaces 21,32. The energy source may be a plasma, a light irradiation and the combination thereof, depending on the materials of the first and second substrates 2,3. In other words, each of the first and second surface-modified regions 211,321 may be a plasma-modified region, a light-modified region or a plasma-light-modified region. Examples of the plasma may include, but are not limited to, oxygen plasma that may be generated by ionizing oxygen gas using high frequency electromagnetic radiation. Examples of the light may include, but are not limited to, ultraviolet, such as vacuum ultraviolet (VUV) with a wavelength ranging from 100 nm to 200 nm, middle ultraviolet (MUV) with a wavelength ranging from 200 nm to 300 nm, and near ultraviolet (NUV) with a wavelength ranging from 300 nm to 400 nm. In this embodiment, each of the first and second surface-modified regions 211, 321 is formed by irradiating the respective surface with vacuum ultraviolet. As such, the first and second surface-modified regions 211,321 may have a plurality of reactive functional groups (such as hydrophilic functional groups, e.g., ketone group, ether group, carboxyl group, hydroxyl group, etc.).

Step S3: contacting the first and second substrates 2,3 in such a manner that the first and second substrates 2,3 are connected with each other through a physical interaction between the first and second surface-modified regions 211, 321. The first and second substrates 2,3 cooperatively define a space 40 therebetween. In certain embodiments, the step S3 is implemented by thermo-compression. In certain embodiments, the physical interaction between the first and second surface-modified regions 211,321 is a hydrophilic interaction by virtue of the hydrophilic functional groups of the first and second surface-modified regions 211,321.

In the first embodiment, the first substrate 2 is disposed within the recess 30 of the second substrate 3, and the space 40 is defined by the first peripheral surface 22 of the first substrate 2 and the recess-defining surface 31 of the second substrate 3. The first peripheral surface 22 extends perpendicularly from the first connecting surface 21, and is substantially parallel to the surrounding surface 311.

For achieving better connection between the first and second surface-modified regions 211,321, the operation conditions of the steps S2 and S3 may be optimized according to the materials of the first and second substrates 2,3. The exemplified operation conditions of the steps S2 and S3 with respect to the materials of the first and second substrates 2,3 are shown in Table 1. It can been seen from Table 1 that in Step S3, the contact of the first and second substrates 2,3 may be conducted by thermo-compression at a temperature ranging from 80° C. to 130° C. under a pressure ranging from 20 kg/cm$^2$ to 35 kg/cm$^2$ for 2 minutes to 4 minutes.

TABLE 1

| | | Materials of the first and second substrates | | |
|---|---|---|---|---|
| | | PMMA | PC, PS, COP or PMMA | PET |
| Step S2 | Energy source | MUV or NUV | VUV | Oxygen plasma* |
| | Wavelength (nm) | 284 to 365 | 172 | — |
| | Power (W) | 300 | 10 | 300 |
| | Time (sec) | 180 | 60 | 30 |
| Step S3 | Temperature (° C.) | 90 | 80 to 130 | 120 |
| | Pressure (kg/cm$^2$) | 30 | 30 | 24 |
| | Time (min) | 3 | 3 | 3 |

*The flow rate of the oxygen gas is 400 mL/min.

Step S4: providing a bonding member 4 within the space 40 to bond the first and second substrates 2,3 together. In certain embodiments, the bonding member 4 surrounds and encloses the first and second surface-modified regions 211, 321.

In certain embodiments, the bonding member 4 is an adhesive. Examples of the adhesive may include, but are not limited to, quick drying glue, instant glue, an epoxy adhesive (AB glue) capable of being cured at room temperature, and ultraviolet curing glue (UV glue). The UV glue may be commercially obtained from Double-O Technology Co., Ltd (Cat. No. DV-3927). The instant glue may be commercially obtained from Chang Chun Plastics Co., Ltd. (Cat. No. CA-260).

In other embodiments, the step of providing the bonding member 4 (step S4) is performed by adding a solvent into the space 40 and dissolving a portion of the first substrate 2 and a portion of the second substrate 3 that cooperatively define the space 40 with the solvent, and then curing/hardening the dissolved portions of the first and second substrates 2,3 (e.g., by heating) to form the bonding member 4, the bonding member 4 thus bonding the first and second substrates 2,3 together. The type of the solvent may be chosen depending on the materials of the first and second substrates 2,3. In the first embodiment, ethanol serving as the solvent is added into the space 40 to dissolve a portion of the first substrate 2 and a portion of the second substrate 3, and then removed by heating. If the space 40 is narrow, the solvent may enter the space 40 through capillary action.

After the first and second substrates 2,3 are bonded together, the channel 50 formed on one of the first and second substrates 2,3 is covered by the other one of the first and second substrates 2,3 to define a microfluidic unit 5 between the first and second substrates 2,3. In the first embodiment, the microfluidic unit 5 is disposed between the first and second surface-modified regions 211,321 and is surrounded and enclosed by the bonding member 4. The channel 50 has two opposite end portions 51 respectively communicating with the two thorough holes 23 of the first substrate 2.

It should be noted that the configuration of the microfluidic unit 5 can be designed according to actual need and is not limited to this embodiment. For example, in certain embodiments, the channel 50 may be formed on the first connecting surface 21 of the first substrate 2. In certain embodiments, the microfluidic unit 5 may have two channels that are respectively formed on the first and second connecting surfaces 21,32 and that are in communication with each other.

According to this disclosure, the substrate assembly made by the method of bonding substrates as mentioned above may be used with a biological detector to serve as a biological detecting device for detecting a biological sample, e.g., blood, urine, or interstitial fluid. The substrate assembly may be also adapted to serve as a reactor for gas reactions (such as a hydrogen-oxygen reactor).

The first embodiment of the substrate assembly according to this disclosure includes the first substrate 2, the second substrate 3, the bonding member 4 and the microfluidic unit 5.

The first substrate 2 includes the first connecting surface 21 that has the first surface-modified region 211, the first peripheral surface 22 that is connected to and angularly extends from the first connecting surface 21, and the two thorough holes 23 for a liquid biological sample or gas to flow into or out of the microfluidic unit 5. In this embodiment, the first peripheral surface 22 perpendicularly extends from the first connecting surface 21.

The second substrate 3 is formed with the recess 30 defined by the recess-defining surface 31. The recess-defining surface 31 has the second connecting surface 32 having the second surface-modified region 321, and the surrounding surface 311 that extends upwardly from the second connecting surface 32. The first substrate 2 is disposed within the recess 30, and the first surface-modified region 211 contacts and is connected to the second surface-modified region 321. The first peripheral surface 22 and the recess-defining surface 31 cooperatively define the space 40.

The bonding member 4 is disposed within the space 40 to bond the first and second substrates 2,3 together. The bonding member 4 surrounds and encloses the first and second surface-modified regions 211,321. As such, the bonding member 4 can serve as a barrier to prevent the moisture from entering into the bonded substrates.

The microfluidic unit 5 is disposed between the first and second surface-modified regions 211,321, and is surrounded and enclosed by the bonding member 4. The microfluidic unit 5 includes the channel 50 that has two opposite end portions 51 respectively communicated with the two thorough holes 23 of the first substrate 2 for a liquid biological sample or gas to flow into or out of the microfluidic unit 5.

Figure 6:
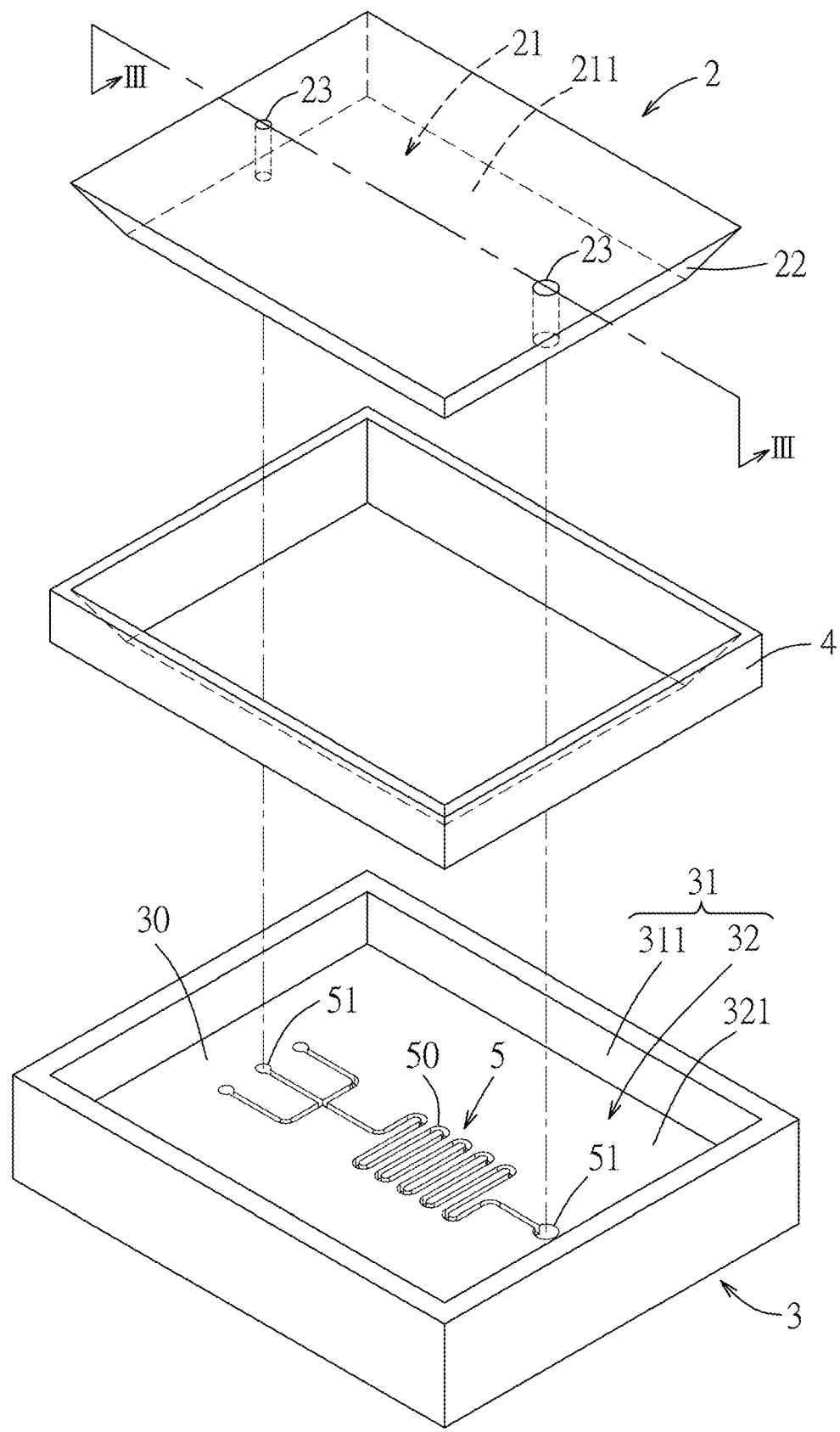
FIG. 6 is a schematic perspective view illustrating a second embodiment of a substrate assembly according to this disclosure.
Figure 7:
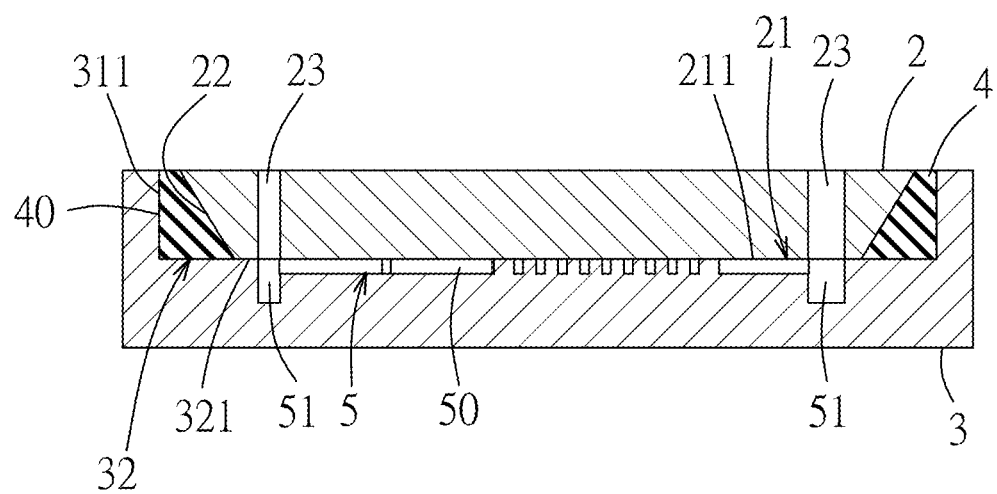
FIG. 7 is a sectional view taken along line in FIG. 6.

Referring to FIGS. 6 and 7, a second embodiment of the substrate assembly is similar to that of the first embodiment, except that the first peripheral surface 22 of the first substrate 2 inclinedly extends from the first connecting surface 21. For example, the first substrate 2 has a frusto pyramidal or a frusto conical shape. The procedure to form the second embodiment of the substrate assembly is the same as that of the first embodiment.

Figure 8:
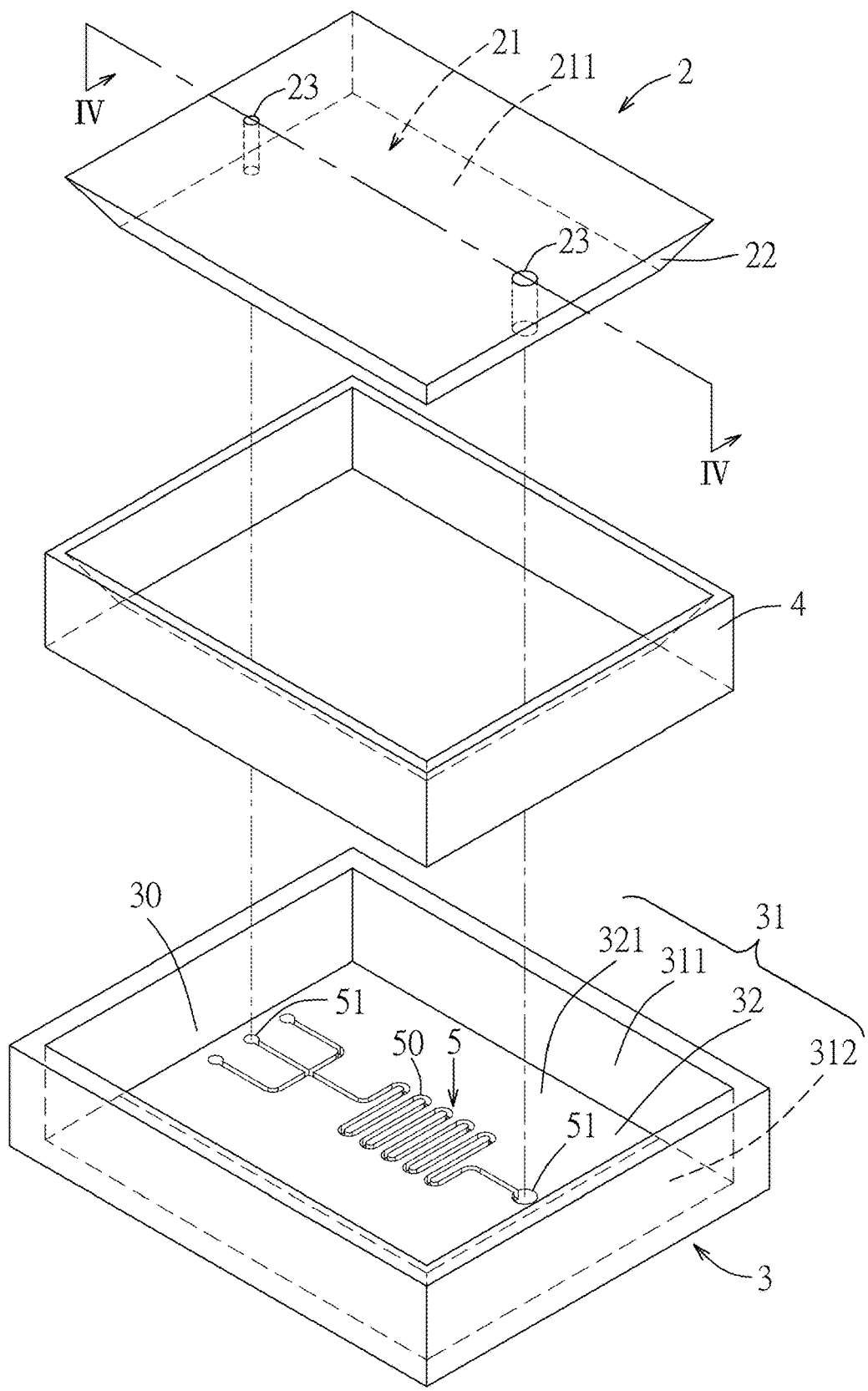
FIG. 8 is a schematic perspective view illustrating a third embodiment of a substrate assembly according to this disclosure.
Figure 9:
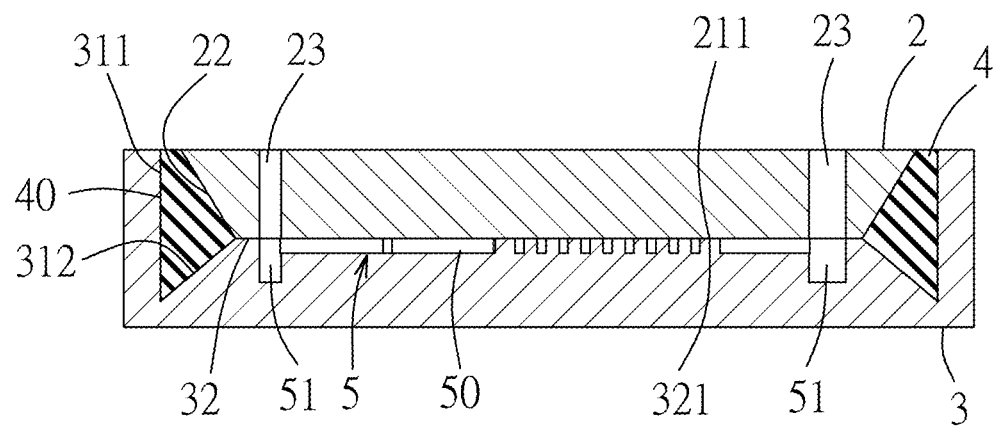
FIG. 9 is a sectional view taken along line IV-IV in FIG. 8.

Referring to FIGS. 8 and 9, a third embodiment of the substrate assembly is similar to that of the second embodiment, except that the recess-defining surface 31 of the second substrate 3 further includes an inclined surface 312. The inclined surface 312 interconnects the surrounding surface 311 and the second connecting surface 32, and is slanted with respect to the surrounding surface 311 and the second connecting surface 32. In addition, the space 40 is cooperatively defined by the first peripheral surface 22, the surrounding surface 311, and the inclined surface 312. The procedure to form the third embodiment of the substrate assembly is the same as that of the first embodiment.

Figure 10:
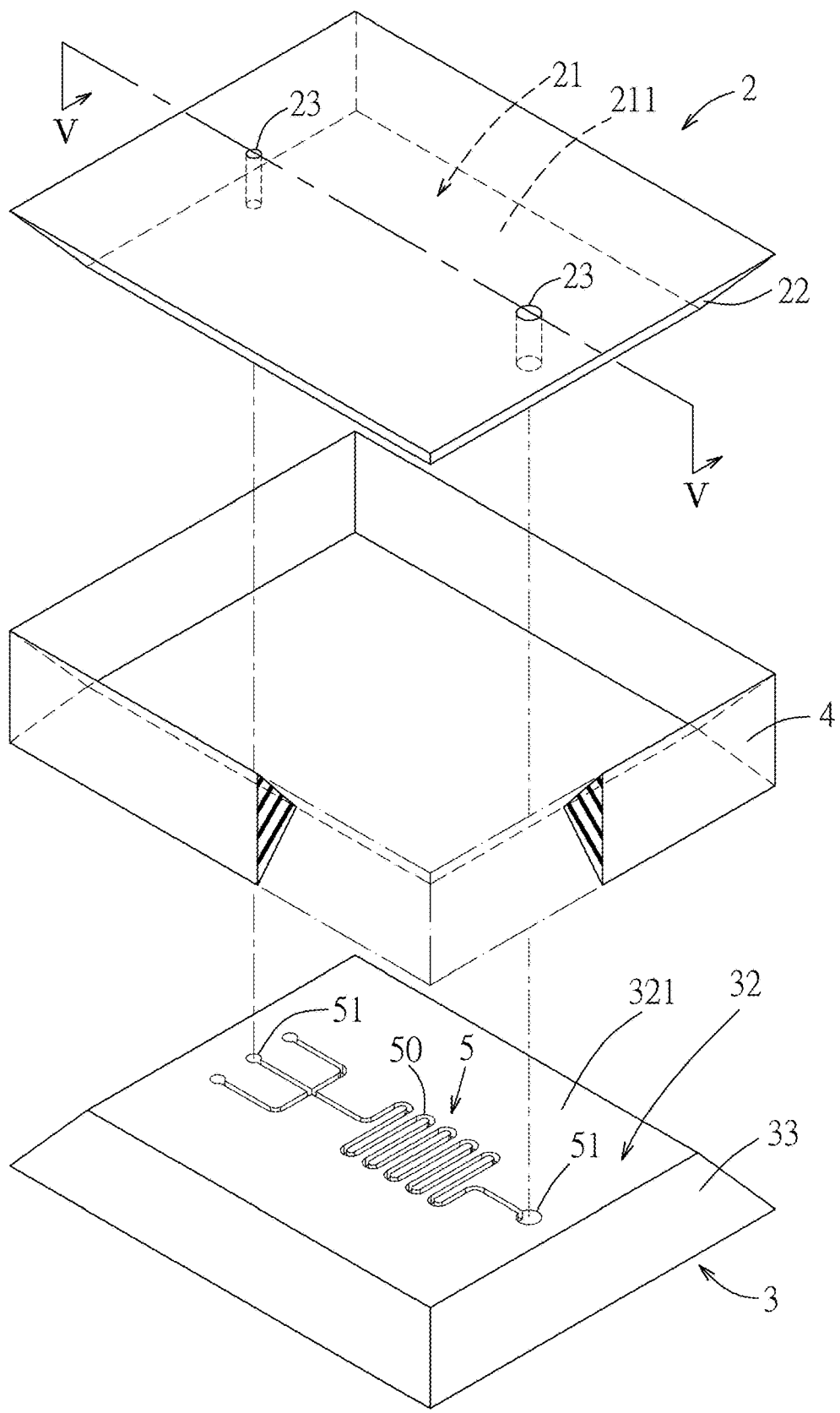
FIG. 10 is a schematic perspective view illustrating a fourth embodiment of a substrate assembly according to this disclosure.
Figure 11:
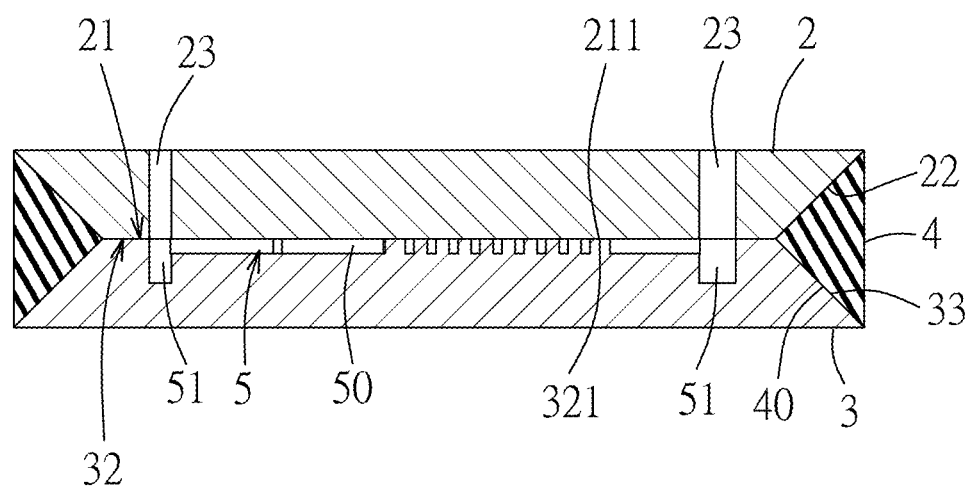
FIG. 11 is a sectional view taken along line V-V in FIG. 10.

Referring to FIGS. 10 and 11, a fourth embodiment of the substrate assembly is similar to that of the second embodiment, except that the second substrate 3 used in the fourth embodiment includes the second connecting surface 32 that has the second-modified region 321 connected to the first surface-modified region 211, and a second peripheral surface 33 that extends inclinedly from the second connecting surface 32 (e.g., the second peripheral surface has a frusto pyramidal shape or a frusto conical shape). In addition, the first and second peripheral surfaces 22,33 intersects each other to cooperatively define the space 40. The procedure to form the fourth embodiment of the substrate assembly is the same as that of the first embodiment.

Figure 12:
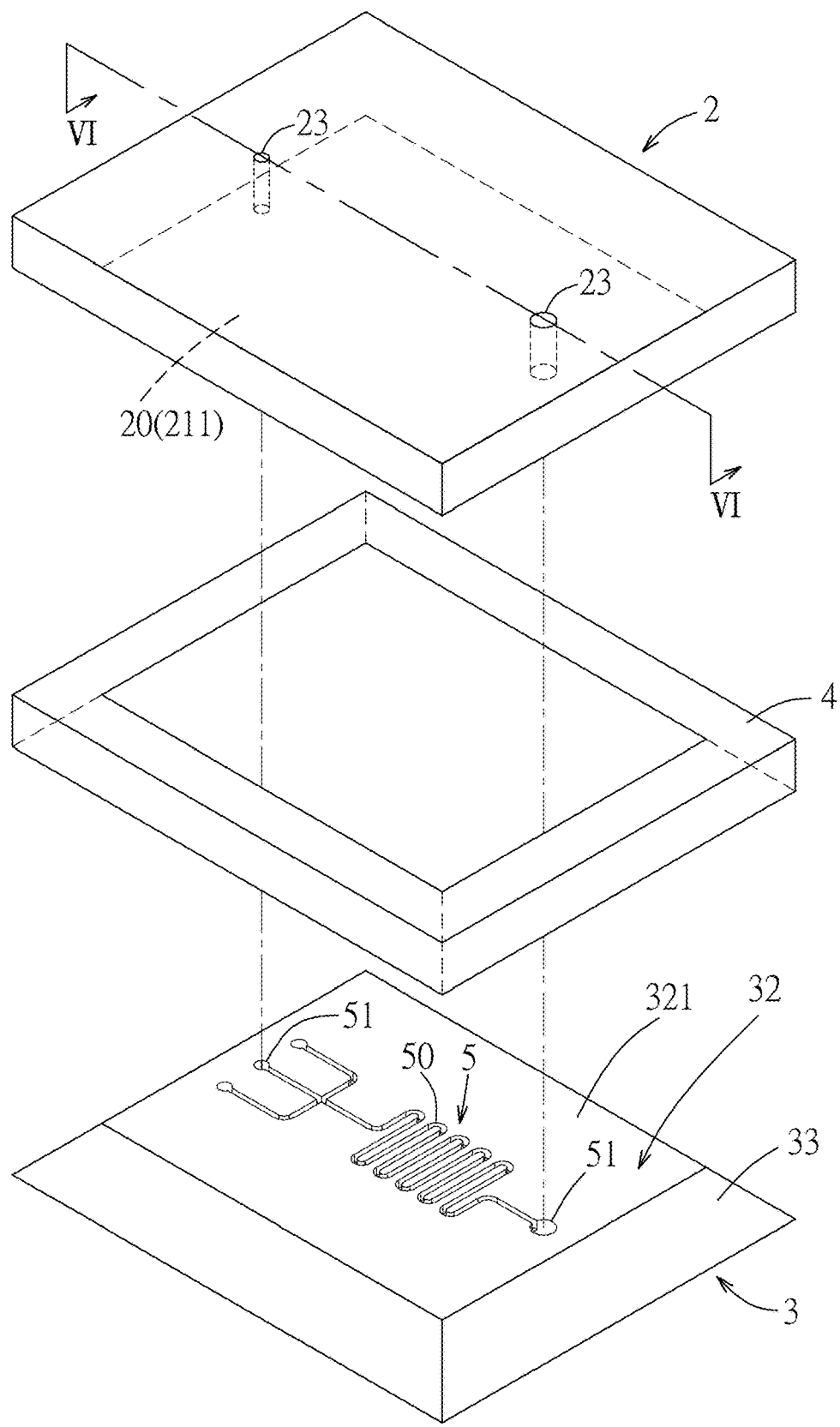
FIG. 12 is a schematic perspective view illustrating a fifth embodiment of a substrate assembly according to this disclosure.
Figure 13:
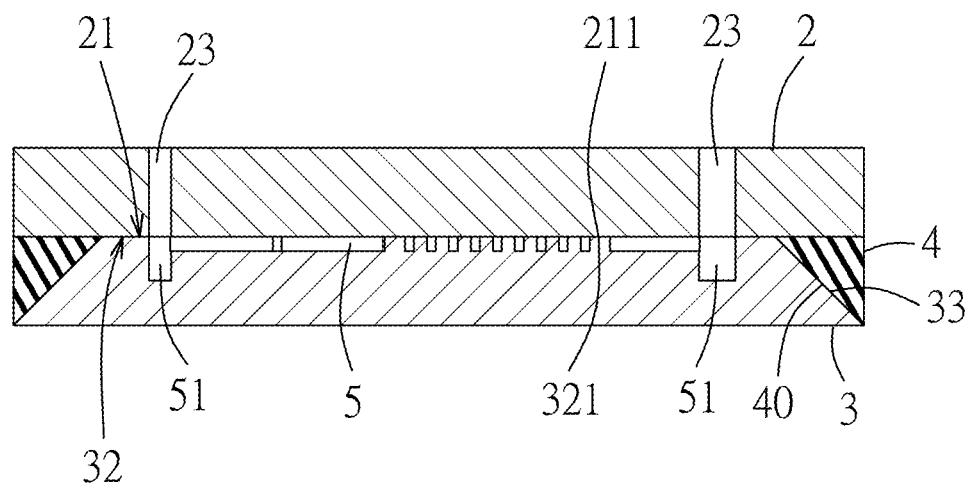
FIG. 13 is a sectional view taken along line VI-VI in FIG. 12.

Referring to FIGS. 12 and 13, a fifth embodiment of the substrate assembly is similar to that of the first embodiment, except that the second substrate 3 used in the fifth embodiment includes the second connecting surface 32 that has the second-modified region 321 connected to the first surface-modified region 211, and a second peripheral surface 33 that extends inclinedly from the second connecting surface 32 (e.g., the second peripheral surface has a frusto pyramidal shape or a frusto conical shape). In addition, the second peripheral surface 33 and the first connecting surface 21 cooperatively defining the space 40. The procedure to form the fifth embodiment of the substrate assembly is the same as that of the first embodiment.

Figure 14:
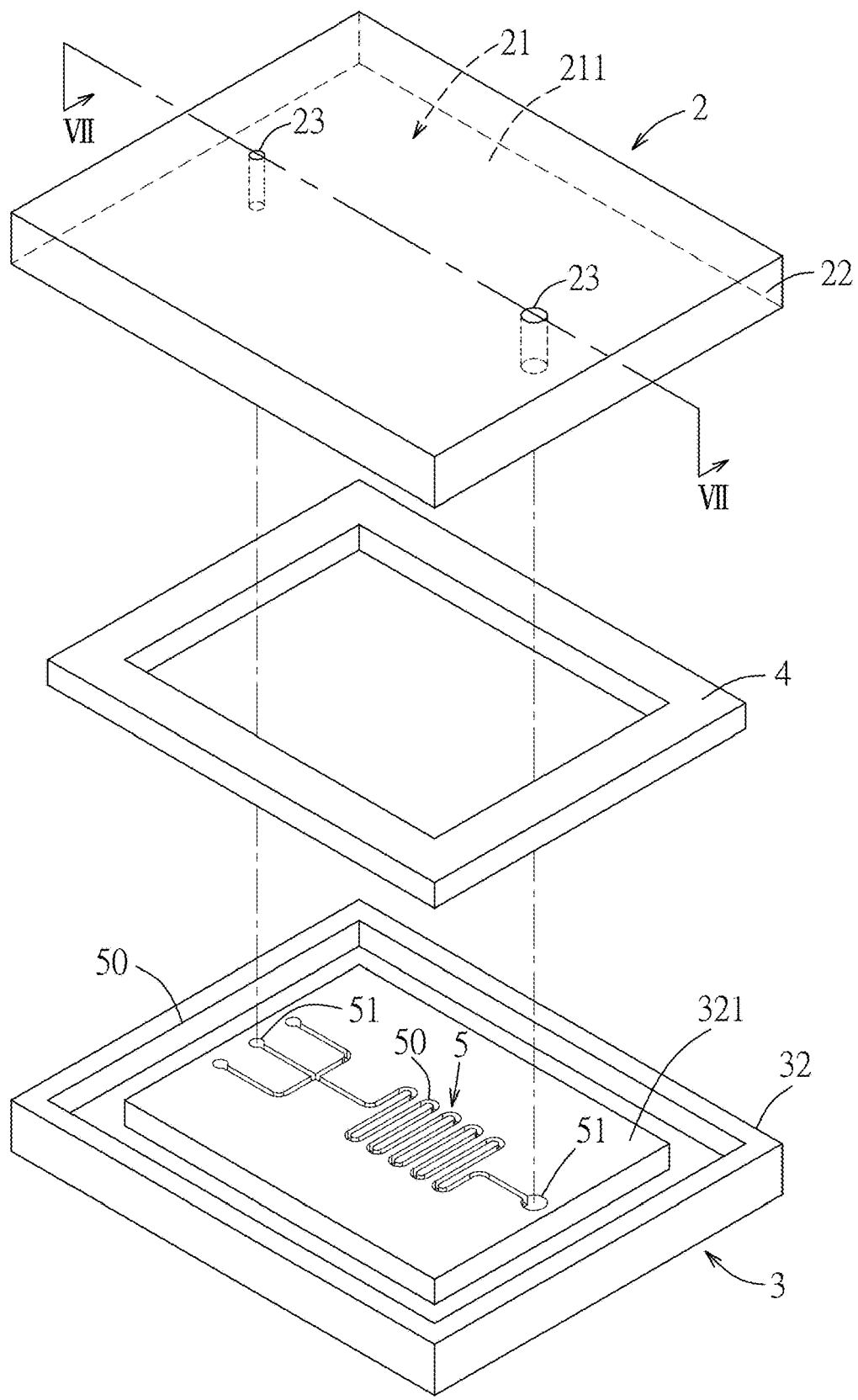
FIG. 14 is a schematic perspective view illustrating a sixth embodiment of a substrate assembly according to this disclosure.
Figure 15:
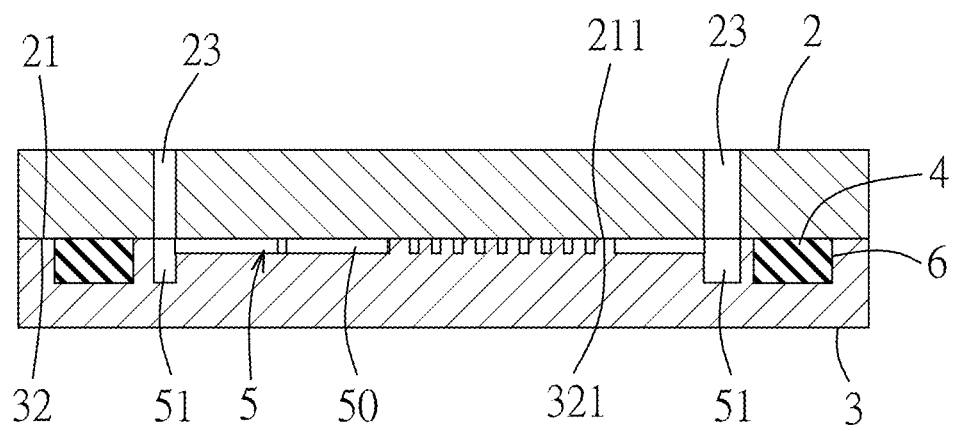
FIG. 15 is a sectional view taken along line VII-VII in FIG. 14.

Referring to FIGS. 14 and 15, a sixth embodiment of the substrate assembly is similar to that of the first embodiment, except that the second substrate 3 used in the sixth embodiment includes the second connecting surface 32 that has the second-modified region 321 connected to the first surface-modified region 211. One of the first substrate 2 and the second substrate 3 may be formed with a groove 6 serving as the space 40. In this embodiment, the second connecting surface 32 of the second substrate 3 is formed with the groove 6 in which the bonding member 4 is disposed. The procedure to form the sixth embodiment of the substrate assembly is the same as that of the first embodiment.

The disclosure will be further described by way of the following examples. However, it should be understood that the following examples are solely intended for the purpose of illustration and should not be construed as limiting the disclosure in practice.

EXAMPLES

Preparation of a Substrate Assembly

Example 1 (E1)

The substrate assembly of E1 has a structure the same as that of the above-mentioned fourth embodiment. Specifically, two substrates were made of PMMA, each included a connecting surface and a peripheral surface extending inclinedly from the connecting surface. The connecting surface of each substrate was irradiated with VUV having a wavelength of 172 nm under a power of 10 W for 60 seconds, so as to form a UV modified-region having hydrophilic functional groups (i.e., hydroxyl groups) on the connecting surface of each substrate. Then, one of the substrates was contacted with the other one of the substrates through thermo-compression at 96° C. under a pressure of 30 kg/cm$^2$ for 3 minutes, in such a manner that the substrates were connected with each other through a physical interaction (i.e., a hydrophilic interaction) between the UV modified-regions. The peripheral surfaces of the two substrates intersected each other to cooperatively define a space. Ethanol was added into the space to dissolve portions of the peripheral surfaces. Then, the dissolved portions of the substrates was cured at 85° C. to form a bonding member within the space, so as to bond the substrates together, thereby obtaining the substrate assembly. The bonding member surrounded and enclosed the UV modified-regions.

Comparative Example 1 (CE1)

Figure 2:
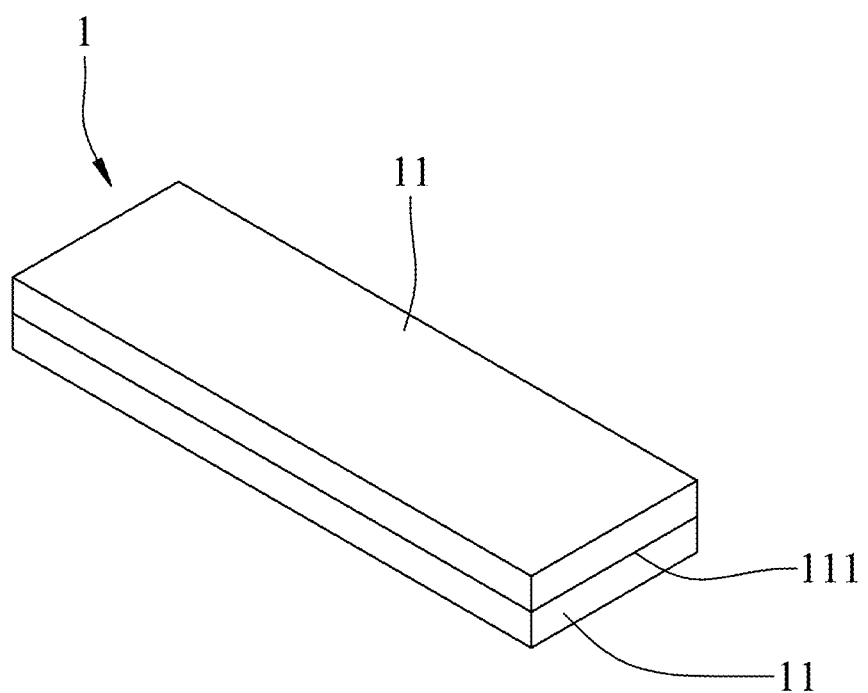
FIG. 2 is a schematic view illustrating the conventional substrate assembly of FIG. 1.

The substrate assembly of CE1 having a configuration shown in FIG. 2 was prepared according to the conventional method of bonding substrates as described in the background. The differences between the substrate assemblies of E1 and CE1 residue in that each substrate in CE1 has the peripheral surface perpendicular to the connecting surface, and that the bonding member is not provided in CE1.
Determination of Bonding Strength To determine the bonding strength between the bonded substrates, the substrate assembly of each example was subjected to the following experiments.
Bonding Strength of the Substrate Assembly The bonding strength between the substrates of the substrate assembly of each example was determined using a handy force gauge (purchased from, ALGOL; Cat. No. HF-10, length resolution: 0.01 mm). When the bonded substrates started to detach from each other, the force value (T1) applied thereto was determined.
Bonding Strength of the Substrate Assembly after Ultrasonic Oscillation Treatment The substrate assembly of each of E1 and CE1 was placed in an ultrasonic oscillator (purchased from Elma Schmidbauer GmbH; Cat. No. S60H) and oscillated under an oscillation frequency of 37 kHz at 25° C. for 60 min. After standing for 12 hours, the bonding strength between substrates of the substrate assembly was measured using the procedure and instrument described in the above section of "Bonding strength of the substrate assembly". When the bonded substrates started to detach from each other, the force value (T2) applied thereto was determined.
Bonding Strength of the Substrate Assembly after Heating Treatment The substrate assembly of each of E1 and CE1 was heated in water at 98° C. for 30 min. After standing for 12 hours, the bonding strength between substrates of the substrate assembly was measured using the procedure and instrument described in the above section of "Bonding strength of the substrate assembly". When the bonded substrates started to detach from each other, the force value (T3) applied thereto was determined.

The force values T1 to T3, and the decreasing percentage of bonding strength after ultrasonic oscillation treatment (DP1) or heating treatment (DP2) are shown in Table 2.

TABLE 2

|  | T1 (gf) | T2 (gf) | DP1 (%) | T3 (gf) | DP2 (%) |
| --- | --- | --- | --- | --- | --- |
| CE1 | 3050.4 | 1352.9 | 55.65 | 1228.7 | 59.72 |
| E1 | 9224.6 | 9073.8 | 1.63 | 8321.7 | 9.79 |

DP1 = [(T1 − T2)/T1] × 100%
DP2 = [(T1 − T3)/T1] × 100%

It can be seen from Table 2 that the force needed for separating the substrate assembly of E1 is higher than that needed for separating the substrate assembly of CE1, even after ultrasonic oscillation treatment or heating treatment, indicating the substrate assembly of this disclosure exhibits superior bonding strength. In addition, the decreasing percentage of bonding strength for the substrate assembly of this disclosure either after ultrasonic oscillation treatment or after heating treatment is also significantly lower than that of CE1, indicating that the substrate assembly of this disclosure is more resistant to the ultrasonic oscillation treatment and heating treatment, thereby having a longer service life.

In view of the foregoing, through the bonding member and the physical interaction of the surface-modified regions, the substrates can be more stably bonded together and the substrate assembly according to this disclosure is more resistant to external force, thereby preventing the bonded substrates from separating easily. In addition, with the bonding member surrounding a periphery of the surface-modified regions, the substrates of the substrate assembly according to this disclosure could be seamlessly bonded together so as to prevent moisture from entering the bonded substrates.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method of bonding substrates, comprising steps of:
providing a first substrate and a second substrate, the first substrate having a first connecting surface, first non-connecting surface opposite to the first connecting surface, and a first peripheral surface interconnecting the first connecting surface to the first non-connecting surface, the second substrate having a second connecting surface and a second peripheral surface extending from the second connecting surface;
subjecting the first connecting surface of the first substrate and the second connecting surface of the second substrate to a surface-modifying treatment, so as to form a first surface-modified region on the first connecting surface and a second surface-modified region on the second connecting surface, the first surface-modified region having a functionality different from those of the first non-connecting surface and the first peripheral surface of the first substrate, the second surface-modified region having a functionality different from that of the second peripheral surface of the second substrate;
contacting the first and second substrates in such a manner that the first connecting surface of the first substrate and the second connecting surface of the second substrate are directly connected with each other through a physical interaction between the first and second surface-modified regions; and
filling a bonding member in a space which is formed between the first substrate and the second substrate that are not subjected to the surface-modifying treatment after the step of contacting the first and second substrates such that the first and second substrates are bonded together.

2. The method as claimed in claim 1, wherein:
in the step of providing the first and second substrates, the first peripheral surface of the first substrate angularly extends from the first connecting surface to the first non-connecting surface, and the second substrate is formed with a recess, the recess being defined by a recess-defining surface that has the second connecting surface and the second peripheral surface; and
in the step of contacting the first and second substrates, the first substrate is entirely disposed within the recess of the second substrate in such a manner that the first peripheral surface and the recess-defining surface cooperatively define the space.

3. The method as claimed in claim 2, wherein the first peripheral surface of the first substrate non-perpendicularly extends from the first connecting surface to the first non-connecting surface.

4. The method as claimed in claim 1, wherein the second substrate further includes a second non-connecting surface opposite to the second connecting surface and the second peripheral surface of the second substrate non-perpendicularly extends from the second connecting surface to the second non-connecting surface, the second peripheral surface and the first connecting surface cooperatively defining the space.

5. The method as claimed in claim 4, wherein the first substrate includes the first peripheral surface non-perpendicularly extending from the first connecting surface to the first non-connecting surface, the first and second peripheral surfaces intersecting each other to cooperatively define the space.

6. The method as claimed in claim 1, wherein one of the first and second substrates is formed with a groove serving as the space, the groove being filled with the bonding member.

7. The method as claimed in claim 1, wherein:
in the step of providing the first and second substrates, one of the first and second substrates is formed with a channel and other one of the first and second substrates is not formed with the channel;
after the first and second substrates are bonded together, the channel is covered by the other one of the first and second substrates that is not formed with the channel to define a microfluidic unit between the first and second substrates.

8. The method as claimed in claim 1, wherein the bonding member surrounds the first and second surface-modified regions.

9. The method as claimed in claim 1, wherein the step of filling the bonding member in the space includes the sub-steps of dissolving a portion of the first substrate and a portion of the second substrate that cooperatively define the space using a solvent, and curing the dissolved portions of the first and second substrates to form the bonding member.

10. The method as claimed in claim 9, wherein the solvent includes ethanol.

* * * * *